United States Patent [19]

Adachi

[11] 4,100,429
[45] Jul. 11, 1978

[54] FET LOGIC CIRCUIT FOR THE DETECTION OF A THREE LEVEL INPUT SIGNAL INCLUDING AN UNDETERMINED OPEN LEVEL AS ONE OF THREE LEVELS

[75] Inventor: Yoshio Adachi, Kodaira, Japan

[73] Assignee: Hitachi, Ltd., Japan

[21] Appl. No.: 752,141

[22] Filed: Dec. 20, 1976

[30] Foreign Application Priority Data

Jan. 7, 1976 [JP] Japan .................................. 51-784

[51] Int. Cl.² .................. H03K 19/08; H03K 19/40; H03K 17/18; H03K 3/353
[52] U.S. Cl. ................................. 307/205; 307/209; 307/214; 307/251; 307/279
[58] Field of Search ............... 307/205, 209, 214, 251, 307/244, 304, 279, 208, 269

[56] References Cited

U.S. PATENT DOCUMENTS

| 3,609,411 | 9/1971 | Ma et al. | 307/205 X |
| 3,812,384 | 5/1974 | Skorup | 307/279 X |
| 3,845,328 | 10/1974 | Hollingsworth | 307/205 X |
| 3,950,656 | 4/1976 | Sumida et al. | 307/251 X |
| 3,969,633 | 7/1976 | Paluck et al. | 307/209 X |

Primary Examiner—Larry N. Anagnos
Attorney, Agent, or Firm—Craig & Antonelli

[57] ABSTRACT

A logic circuit in which a first switching means controlled by a first clock pulse signal and a second switching means controlled by a second clock pulse signal are connected in series with each other between the terminals of a first and a second power source, the first and the second clock pulse signals being out of phase from each other, in which an external signal having three levels is applied as an input to the junction point of the first and second switching means, the three-level signal has a first level, i.e. the voltage of the first power source, a second level, i.e. the voltage of the second power source, and an open level, and in which an output is delivered at the junction point. In the logic circuit, when the external input is at the first or the second level, an output corresponding to the input is delivered irrespective of the clock pulses; and when the external input is at the open level, the first level is delivered on the arrival of the first clock pulse while the second level is delivered on the arrival of the second clock pulse, whereby the three levels externally applied can be identified.

17 Claims, 5 Drawing Figures

FET LOGIC CIRCUIT FOR THE DETECTION OF A THREE LEVEL INPUT SIGNAL INCLUDING AN UNDETERMINED OPEN LEVEL AS ONE OF THREE LEVELS

BACKGROUND OF THE INVENTION

1. Field of the Invention

This invention relates to a logic circuit and more particularly to a three-level input logic circuit for receiving at its input terminal and processing a logic input having three different levels.

2. Description of the Prior Art

In an ordinary digital circuit, logic operation is carried out by using the combinations of binary quantities (e.g. high level and low level). Accordingly, if the external input applied to an input terminal is of analog quantity, the level of the input is forced to be processed by an analog-digital converter which converts an analog quantity to a binary quantity. This means that N input terminals can receive only $2^N$ different combinations of the levels. A variety of such circuits as to provide multiple levels have already been proposed in the field of the art under consideration. For example, the specification of the U.S. Pat. No. 3,939,676 to Minoru Fujita, discloses a multi-level voltage circuit for liquid cell display device. In all the prior art propositions, however, only two levels are derived from an individual input. This also leads to the fact that N input terminals can only receive $2^N$ different combinations of levels. Consequently, all the circuits hitherto proposed have a drawback from the standpoint of reducing the number of electrodes or contacts in a semiconductor integrated circuit.

In case the external input is derived from, for example, a mechanical switch, three states (i.e. a power source level, an open level and a ground level) can be easily realized. It is therefore required to provide an input circuit for conducting the three levels into a logic system.

SUMMARY OF THE INVENTION

The object of this invention is to provide a three-level input logic circuit which can deliver three logic outputs corresponding to the three input levels received through a single input terminal.

According to this invention, a first level, a second level and an open level are used as three input levels through a single input terminal. Three logic levels can be detected as outputs corresponding to the first, second and open levels by detecting the open level as an output logic state.

According to this invention, N input terminals can produce $3^N$ different combinations of levels. If this invention is applied to IC's, the number of outerleads or input/output terminals to be used can be decreased with a considerable merit of improvement in integration density.

DESCRIPTION OF THE PREFERRED EMBODIMENT

Figure 1:
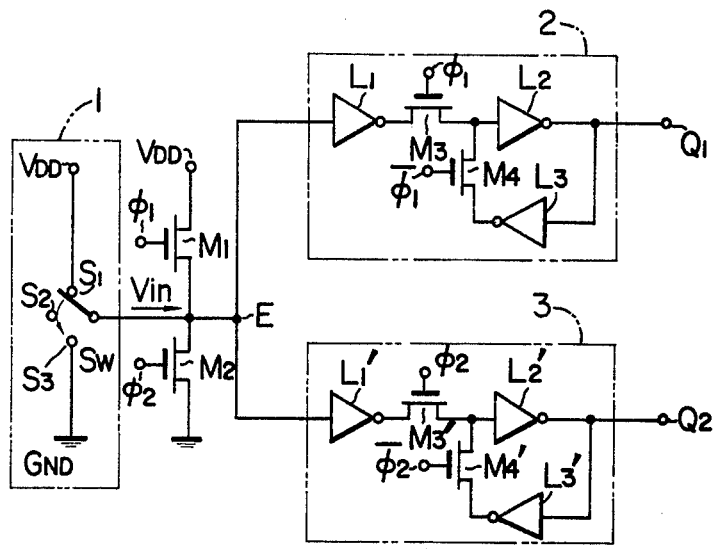
FIG. 1 shows a logic circuit as an embodiment of this invention.

FIG. 1 shows a logic circuit as an embodiment of this invention, the configuration of which is as follows. A dash-line rectangular box 1 indicates means for generating an external input $V_{in}$ having three levels, in which a mechanical switch SW is provided between a power source $V_{DD}$ and the ground GND so that $V_{DD}$ level, GND level or OPEN level may be produced according as the movable contact of the switch SW is on the stationary contact $S_1$, $S_3$ or $S_2$ of the switch SW. Between the power source $V_{DD}$ and the ground GND are connected in series an insulated gate field effect transistor (hereafter referred to simply as FET) $M_1$ which turns conductive on the arrival of a first clock pulse signal $\phi_1$ and a FET $M_2$ which has the same conductivity type of channel as FET $M_1$ and turns conductive on the arrival of a second clock pulse signal $\phi_2$ out of phase from the first clock pulse signal $\phi_1$. The external input $V_{in}$ is applied to the junction point of the FET's $M_1$ and $M_2$. Moreover, to the junction point are coupled two temporary storage circuits 2 and 3 which perform its storage operation in synchronism with the clock pulse signals $\phi_1$ and $\phi_2$. The temporary storage circuit 2(3) consists of three inverters $L_1$, $L_2$ and $L_3$ ($L'_1$, $L'_2$ and $L'_3$), FET $M_3$ ($M'_3$) which turns conductive when receiving the clock pulse $\phi_1$ ($\phi_2$) and FET $M_4$ ($M'_4$) which turns conductive when receiving a clock pulse $\bar{\phi}_1$ ($\bar{\phi}_2$) opposite in phase to the clock pulse $\phi_1$ ($\phi_2$).

The operation of the temporary storage circuit is as follows.

On the arrival of the clock pulse $\phi_1$ ($\phi_2$), the output of the inverter $L_3$ ($L'_3$) is interrupted so that the input is directly taken out as an input through the inverters $L_1$ ($L'_1$) and $L_2$ ($L'_2$). On the other hand, on the arrival of the clock pulse $\bar{\phi}_1$ ($\bar{\phi}_2$), the output of the inverter $L_1$ ($L'_1$) serving as an input gate is interrupted so that the content of the storage circuit is held.

According to this invention, the temporary storage circuits 2 and 3 are so designed as to deliver outputs $Q_1$ and $Q_2$ each having two levels. The following description of operation will make clear how the object of this invention is attained.

Figure 2:
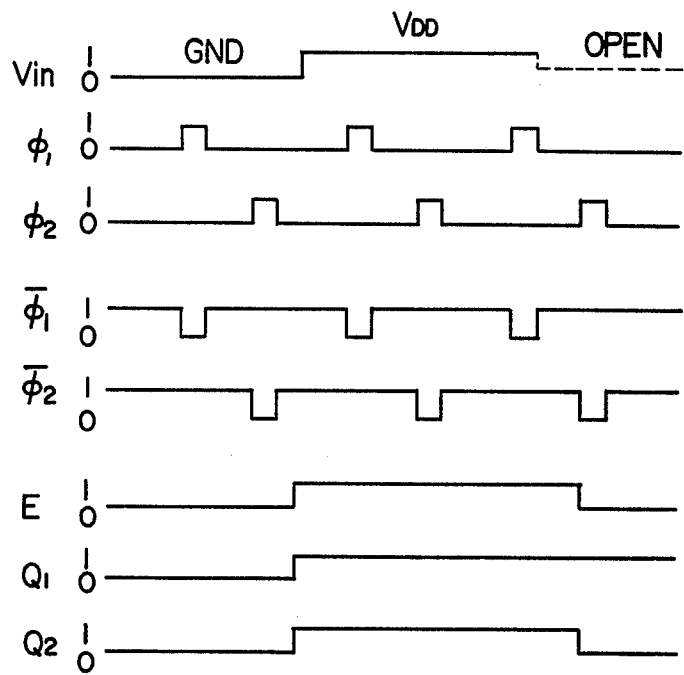
FIG. 2 is a timing chart useful in explaining the operation of the logic circuit in FIG. 1.

FIG. 2 is a timing chart for explaining the circuit shown in FIG. 1 and the operation of the logic circuit will be explained below with the aid of FIGS. 1 and 2. In the following description, it is assumed that the $V_{DD}$ level of the power source is "1" while the ground GND level is "0" (positive logic is employed throughout the specification). It is also assumed that the levels GND, $V_{DD}$ and OPEN of the input $V_{in}$ are applied by changing over the switch SW in the order mentioned above, as seen from the timing chart in FIG. 2, that the clock pulse signals $\phi_1$ and $\phi_2$ are applied in such a manner that each pulse of the signal $\phi_1$ never occurs simultaneously with each pulse of the signal $\phi_2$, and that the impedances of the FET's $M_1$ and $M_2$ are so high as not to affect the applied level of the input $V_{in}$.

(1) When $V_{in}$ is at GND level, the level "0" appears at point E irrespective of whether the clock pulse $\phi_1$ or $\phi_2$ is applied or not since the impedances of the FET's $M_1$ and $M_2$ are very high. Accordingly, the outputs $Q_1$ and $Q_2$ of the temporary storage circuits 2 and 3 are both "0".

(2) When $V_{in}$ is at $V_{DD}$ level, the application of the clock pulse $\phi_1$ or $\phi_2$ has no influence upon the level of the input $V_{in}$. Accordingly, the level "1" appears at the point E and therefore at the output terminals $Q_1$ and $Q_2$ of the temporary storage circuits 2 and 3.

(3) When $V_{in}$ is at OPEN level, the logic circuit according to this invention exhibits an especially remarkable feature. Namely, in this case, the operation of the FET $M_1$ or $M_2$ is decisive of the outputs of the logic circuit, that is, the level "1" appears at the point E when the clock pulse $\phi_1$ is applied to the gate of the FET $M_1$ while the level "0" appears at the point E when the clock pulse $\phi_2$ is applied to the gate of the FET $M_2$. As a result of the operation of the temporary storage circuits, the level "1" appears as the output $Q_1$ of the circuit 2, on the application of the clock pulse $\phi_1$ while the level "0" appears as the output $Q_2$ of the circuit 3, on the application of the clock pulse $\phi_2$.

As apparent from the above description of the operation, according to this invention, three different combinations of the outputs $Q_1$ and $Q_2$ can be produced in accordance with the three levels of the input.

Figure 3:
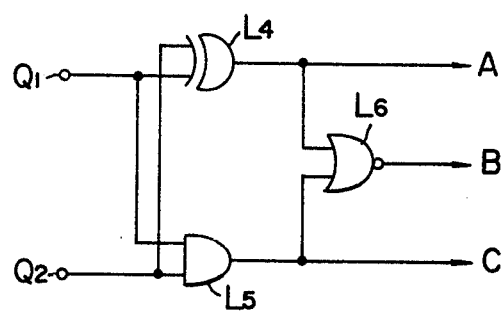
FIG. 3 shows an example of a logic combination circuit.

FIG. 3 shows an example of a circuit for obtaining three outputs by logically combining the three combinations. The logic combination circuit in FIG. 3 consists of an exclusive-OR circuit $L_4$ receiving as its two inputs the outputs $Q_1$ and $Q_2$ of the temporary circuits, an AND circuit $L_5$ receiving as its two inputs the outputs $Q_1$ and $Q_2$, and a NOR circuit $L_6$ receiving as its two inputs the outputs of the exclusive-OR circuit $L_4$ and the AND circuit $L_5$. The outputs of the logic circuits $L_4$, $L_6$ and $L_5$ are used as the three outputs A, B and C above mentioned.

Figure 4:
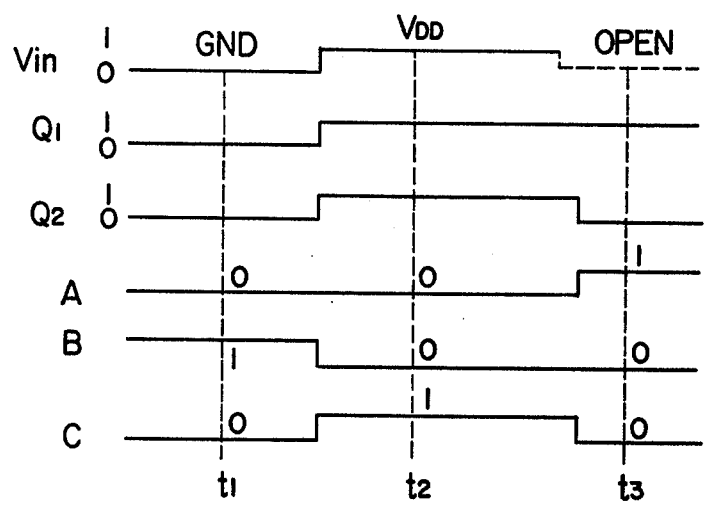
FIG. 4 is a timing chart useful in explaining the operation of the circuit in FIG. 3.

FIG. 4 is a timing chart for explaining the operation of the circuit shown in FIG. 3. Namely, as seen from the timing chart, when the external input $V_{in}$ is at GND level, only the output B of the NOR circuit $L_6$ is "1" and the outputs A and C of the circuits $L_4$ and $L_5$ are "0". When $V_{in}$ is at $V_{DD}$ level, only the output C of the AND circuit $L_5$ is "1" and the other outputs A and B are "0". When $V_{in}$ is at OPEN level, only the output A of the exclusive-OR circuit $L_4$ is "1" and the other outputs B and C are "0".

As apparent from the above description, according to this invention, three different digital signals can be generated by the provision of a single input terminal so that three states can be controlled by the single input terminal. This means that N input terminals will produce $3^N$ different outputs and therefore that if this invention is applied to an IC, the integration density can be improved since the number of outerleads or terminal conductors can be decreased in comparison with the conventional circuit configuration in which N input terminals produces $2^N$ different outputs.

This invention is by no means limited to the above described embodiments but permits of numerous variations.

Figure 5:
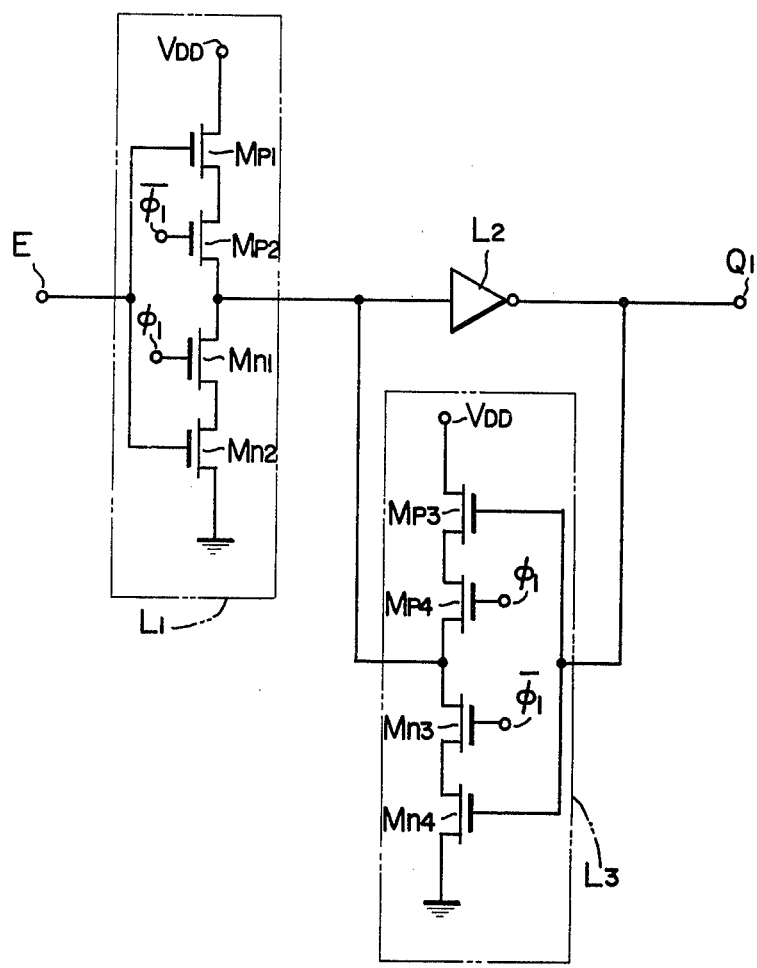
FIG. 5 shows an example of a temporary storage circuit.

For example, the temporary storage circuits 2 and 3 are not limited to those configurations shown in FIG. 1, but may be replaced by any circuit means that perform the same function. A latch circuit may be used as such a temporary storage circuit, in which the inverter $L_1$ is complementary type clock inverter consisting of p-channel FET's $M_{p1}$ and $M_{p2}$ and n-channel FET's $M_{n1}$ and $M_{n2}$ connected in series between the power source and the ground, the FET's $M_{p1}$ and $M_{n2}$ receiving in common the input E, the FET's $M_{p2}$ and $M_{n1}$ receiving clock pulses $\overline{\phi}_1$ and $\phi_1$, respectively, and the junction point of the FET's $M_{p2}$ and $M_{n1}$ serving as an output terminal, while the inverter $L_3$ is a complementary type clock inverter having the same structure ($M_{p3}$, $M_{p4}$, $M_{n3}$ and $M_{n4}$), as shown in FIG. 5. It should be here noted that clock pulses $\overline{\phi}_1$ and $\phi_1$ are applied to FET's $M_{n3}$ and $M_{p4}$, respectively. The latch circuit has an advantage of smaller power consumption in addition to the effect enjoyed by the circuit 2 or 3 in FIG. 1.

Moreover, in the above description of the embodiment of this invention, a mechanical switch is used as the means for producing the external input having three levels, but the mechanical switch may also be replaced by any means having the same function.

Furthermore, the logic combination circuit for obtaining three outputs, shown in FIG. 3 is nothing but an embodiment and may be replaced by any equivalent circuit.

In the above embodiments, FET's are used as switching means, but bipolar transistors may equally be used as such. Moreover, the conductivity of the element may be changed with the polarity of the power source changed (e.g. for a negative power source).

This invention can thus be used widely as a three-level input logic circuit.

I claim:

1. A logic circuit comprising
   (a) a first power source and a second power source having a lower voltage level than said first power source;
   (b) a first and a second switching means, each having an input, an output and a control electrode, said first and second switching means being connected in series between said first and second power sources;
   (c) means for generating a three-level input having a first level, a second level and an open level, said three-level input being applied to a junction point of said first and second switching means;
   (d) means for generating a first clock pulse signal and a second clock pulse signal out of phase from said first clock pulse signal, said first and second clock pulse signals being applied to the control electrodes of said first and second switching means so as to control the switching operation of said first and second switching means;
   wherein the three levels of said three-level input can be detected by obtaining outputs corresponding to said first and second levels when the level of said input is at said first and second levels, and by obtaining, when said level of said input is at said open level, said first level on reception of said first clock pulse and said second level on reception of said second clock pulse.

2. A logic circuit as claimed in claim 1, wherein said first and second switching means are a first and a second insulated-gate type field effect transistor.

3. A logic circuit as claimed in claim 2, wherein source, drain and gate electrodes of said first insulated-gate type field effect transistor are connected respectively with said first power source, said means for generating said three-level input and said means for generating said first clock pulse signal while source, drain and gate electrodes of said second insulated-gate type field effect transistor are connected respectively with said second power source, said means for generating said three-level input and said means for generating said second clock pulse signal.

4. A logic circuit as claimed in claim 1, wherein said second power source is grounded.

5. A logic circuit as claimed in claim 1, wherein said means for generating said three-level input includes therein a mechanical switch, and said first and second power sources, and delivers pulse signals corresponding to said first and second levels when said mechanical switch is connected with said first and second power sources, and also produces a pulse signal having an undetermined "open" level when said mechanical switch is open.

6. A logic circuit as claimed in claim 1, further comprising a parallel circuit of a first and a second storage, connected with the junction point of said first and second switching means, said first storage stores the level of said three-level input taken out of said junction point on the arrival of said first clock pulse while said second storage stores the level of said three-level input taken out of said junction point on the arrival of said second clock pulse, whereby a three-value output is composed by logically combining the outputs of said storages.

7. A logic circuit as claimed in claim 6, wherein said first storage consists of a first, a second and a third inverter and a third and a fourth switching means each having a control, an input and an output electrode;
  said first inverter being connected with said junction point;
  said first inverter, said third switching means and said second inverter being connected in series;
  the output of said second inverter being taken out as the output of said first storage and also fed back through the series-connected circuit of said third inverter and said fourth switching means to the input terminal of said second inverter;
  said first clock pulse signal being applied to the control electrode of said third switching means; and
  a pulse signal having a phase opposite to that of said first clock pulse signal being applied to the control electrode of said fourth switching means and wherein
  said second storage comprises a fourth, a fifth and a sixth inverter and a fifth and a sixth switching means;
  said fourth inverter being connected with said junction point;
  said fourth inverter, said fifth switching means and said fifth inverter being connected in series;
  the output of said fifth inverter being taken out as the output of said second storage and also fed back through the series-connected circuit of said sixth inverter and said sixth switching means to an input terminal of said fifth inverter;
  said second clock pulse signal being applied to the control electrode of said fifth switching means; and
  a pulse signal having a phase opposite to that of said second clock pulse signal being applied to the control electrode of said sixth switching means.

8. A logic circuit as claimed in claim 7, wherein said third, fourth, fifth and sixth switching means respectively include a third, a fourth, a fifth and a sixth insulated-gate type field effect transistor.

9. A logic circuit as claimed in claim 8, wherein the source, drain and gate electrodes of said third insulated-gate type field effect transistor are connected respectively with the output of said first inverter, the input of said second inverter and said means for generating said first clock pulse signal;
  the source, drain and gate electrodes of said fourth insulated-gate type field effect transistor are connected respectively with the output of said third inverter, the input of said second inverter and means for generating said pulse signal having said phase opposite to that of said first clock pulse signal;
  source, drain and gate electrodes of said fifth insulated-gate type field effect transistor are connected respectively with the output of said fourth inverter, the input of said fifth inverter and said means for generating said second clock pulse signal; and
  source, drain and gate electrodes of said sixth insulated-gate type field effect transistor are connected respectively with the output of said sixth inverter, the input of said fifth inverter and means for generating said pulse signal having said phase opposite to that of said second clock pulse signal.

10. A logic circuit as claimed in claim 6, wherein said first storage includes therein a, first, a second, and a third inverter while said second storage includes therein a fourth, a fifth, and a sixth inverter, wherein said first and second inverters are connected in series with each other and the output of said second inverter is taken out as the output of said first storage and also fed back through said third inverter to the input terminal of said second inverter, and wherein said fourth and fifth inverters are connected in series with each other and the output of said fifth inverter is taken out as the output of said second storage and also fed back through said sixth inverter to the input terminal of said fifth inverter.

11. A logic circuit as claimed in claim 10, wherein said first inverter includes therein a series circuit of a first and a second p-channel FET and a first and a second n-channel FET, connected between said first and second power sources, the junction point of the gates of said first p-channel and said second n-channel FET being connected with said junction point of said first and second switching means, the output of said first inverter being taken out of the junction point of the drains of said second p-channel and said first n-channel FET, a clock pulse signal having a phase opposite to that of said first clock pulse signal being applied to the gate of said second p-channel FET, and said first clock pulse signal being applied to the gate of said first n-channel FET,
  wherein said third inverter includes therein a series circuit of a third and a fourth p-channel FET and a third and a fourth n-channel FET, connected between said first and second power sources, the output of said second inverter being applied to the junction point of the gates of said third p-channel and said fourth n-channel FET, the output of said third inverter being taken out of the junction point of the drains of said fourth p-channel and said third n-channel FET, said first clock pulse signal being applied to the gate of said fourth p-channel FET, and a clock pulse signal having a phase opposite to that of said first clock pulse signal being applied to the gate of said third n-channel FET,
  wherein said fourth inverter includes therein a series circuit of a fifth and a sixth p-channel FET and a fifth and a sixth n-channel FET, connected between said first and second power sources, the junction point of the gates of said fifth p-channel and said sixth n-channel FET being connected with the junction point of said first and second switching means, the output of said fourth inverter being taken out of the junction point of the drains of said sixth p-channel and said fifth n-channel FET, a clock pulse having a phase opposite to said second clock pulse signal being applied to the gate of said sixth p-channel FET, and said second clock pulse signal being applied to the gate of said fifth n-channel FET, and wherein said sixth inverter includes therein a series circuit of a seventh and an eighth p-channel FET and a seventh and an eighth n-channel FET, connected between said first and second power sources, the output of said fifth inverter being applied to the junction point of the gates of said seventh p-channel and said eighth n-channel FET, the output of said sixth inverter being taken out of the junction point of the drains of said eighth p-channel and said seventh n-channel FET, said second clock pulse signal being applied to the gate of said eighth p-channel FET, and a clock pulse signal having a phase opposite to that of said second clock pulse signal being applied to the gate of said seventh n-channel FET.

12. A logic circuit for detecting a floating or open condition of an output of a signal source comprising:
   timing means, coupled to said output, for applying thereto a first potential during a first period and a second potential during a second period; and
   means for detecting whether the potential of said output follows the operation of said timing means within said first and second periods.

13. A logic circuit according to claim 12, in which said signal source is a mechanical switch.

14. A logic circuit for detecting a floating or open condition of an output of a signal source which produces a digital signal of a logic "0" and logic "1" and the output of which is coupled to a common node comprising:
   timing means, coupled to said common node, for applying thereto a logic "0" during a first period and a logic "1" during a second period, so that, at said common node there appears a signal corresponding to the output of said signal source regardless of the operation of said timing means when said signal source produces an output of a logic "0" or "1", and a signal corresponding to the output of said timing means during said first and second periods when the output of said signal source is in said open condition;
   a first memory responsive to a signal at said common node during said first period;
   a second memory responsive to a signal at said common node during said second period; and
   gate means, responsive to said first and second memories for producing an output signal representing that the output of said signal source is in said open condition.

15. A logic circuit according to claim 14, in which said signal source is a mechanical switch.

16. A logic circuit comprising:
   a tri-state signal source of a logic "0", a logic "1", and an undetermined open level coupled to a common node;
   timing means, coupled to said common node, for applying thereto a digital signal of a logic "0" during a first period and a digital signal of a logic "1" during a second period, so that, at said common node, there appears a digital signal following said timing means during said first and second periods when the state of said signal source is in said open condition, and a digital signal following said signal source regardless of said timing means when said signal source produces a determined digital level of a logic "0" or "1";
   first memory means responsive to the signal at said common node during said first period;
   second memory means responsive to the signal at said common node during said second period; and
   gating means, responsive to the outputs of said first and second memory means, for logically combining the outputs of said first and second memory means to produce three outputs respectively representing a logic "0", a logic "1", and an open level of said signal source.

17. A logic circuit according to claim 16, in which said tri-state signal source is a mechanical switch.

* * * * *